United States Patent [19]

Sezi

[11] Patent Number: 5,471,133
[45] Date of Patent: Nov. 28, 1995

[54] DIGITAL DEVICE FOR MEASURING THE FREQUENCY OF AN ELECTRICAL SIGNAL

[75] Inventor: Tevfik Sezi, Berlin, Germany

[73] Assignee: Siemens Aktiengeselleschaft, München, Germany

[21] Appl. No.: 318,617

[22] PCT Filed: Mar. 18, 1993

[86] PCT No.: PCT/DE93/00262

§ 371 Date: Oct. 5, 1994

§ 102(e) Date: Oct. 5, 1994

[87] PCT Pub. No.: WO93/20454

PCT Pub. Date: Oct. 14, 1993

[30] Foreign Application Priority Data

Apr. 6, 1992 [DE] Germany ............... 42 11 946.4

[51] Int. Cl.$^6$ ............... G01R 23/165; G01R 23/167
[52] U.S. Cl. ............... 324/76.44; 324/76.47; 364/724.06; 342/195
[58] Field of Search ............... 324/76.44, 76.47; 364/484, 572, 724.01, 724.06; 342/195; 333/165, 166

[56] References Cited

U.S. PATENT DOCUMENTS

| | | | |
|---|---|---|---|
| 4,403,298 | 9/1983 | May, Jr. | 364/724.06 X |
| 4,433,422 | 2/1984 | Kurth | 364/724.06 X |
| 4,438,504 | 3/1984 | Favin | 364/724.06 X |
| 5,089,770 | 2/1992 | Lee et al. | 324/76.44 X |
| 5,198,750 | 3/1993 | Prokin | 324/76.44 |

FOREIGN PATENT DOCUMENTS

| | | |
|---|---|---|
| 3149165 | 7/1983 | Germany . |
| 1434028 | 4/1976 | United Kingdom . |

OTHER PUBLICATIONS

Electrical Design News, vol. 34, No. 2, Jan. 1989, Newton, Mass., US, pp. 149–155, George Dovel: FET analyzers make spectrum analysis a snap.

Primary Examiner—Kenneth A. Wieder
Assistant Examiner—Diep Do
Attorney, Agent, or Firm—Kenyon & Kenyon

[57] ABSTRACT

In order to permit rapid, high-resolution measurement of the frequency of an electrical signal using a digital device, the electrical signal is fed to two linear-phase non-recursive digital filters (3, 20) with symmetrically distributed filter coefficients (a(n), t(n)), one of which is developed as an all-pass filter (3) and the other as a low-pass filter (20). Following the all-pass filter (3) there is a circuit unit (4) in which a logic signal (r(Ω)) is formed by means of two transverse filters (5, 6) time-delay member (7, 9), multipliers (8, 10) and a difference former (11), said logic signal being dependent on the quantity frequency responses of the transverse filters (5, 6) and the square of the scanned values of the all-pass filter (3). A further logic signal (s(Ω)) is generated by a circuit device (21) which is designed in a manner corresponding to the circuit unit (4) and is arranged following the low-pass filter. By quotient formation of the logic signals (r(Ω)), s(Ω)) followed by formation of the square root (24) and the forming of the inverse function (25), the frequency (f) to be measured is determined.

4 Claims, 2 Drawing Sheets

DIGITAL DEVICE FOR MEASURING THE FREQUENCY OF AN ELECTRICAL SIGNAL

BACKGROUND OF INVENTION

Digital devices for measuring the frequency of an electrical signal are known, all of which operate basically in the manner that a counter counts pulses introduced by an oscillator during a time period determined by successive passages through zero of an electrical signal the frequency of which is to be measured. The counter reading at the end of the time interval then represents a measurement of the frequency to be measured.

By way of example, reference may be had in this connection to the published German application 31 49 165 A1 in which a circuit arrangement for measuring the frequency of an alternating voltage is described. Upon the commencement of each period of the alternating voltage, a time is started having a duration which corresponds to the shortest expected period of the alternating voltage. After the execution of this time, a following counter is started into which pulses of an oscillator are introduced until the end of the period being monitored is indicated by a control pulse. The frequency is calculated from the reading of the counter.

SUMMARY OF THE INVENTION

The present invention provides a digital arrangement for measuring the frequency of an electrical signal. In accordance with this arrangement a rapid disturbance-free, highly precise determination of the frequency is made possible.

In order to achieve this purpose in accordance with the invention, in a digital arrangement for the measuring of the frequency of an electrical signal, a linear-phase non-recursive digital filter with symmetrically distributed filter coefficients which is acted on by the electrical signal is developed as an all-pass filter, and a further linear-phase non-recursive digital filter with symmetrically distributed filter coefficients which is also acted on by the signal is so developed as a low-pass filter that its transfer function has a value of one for a predetermined frequency of the electrical signal; following the all-pass filter there is arranged a circuit which in one branch on the input side contains a linear-phase transverse filter with symmetrically distributed filter coefficients, a time-delay member connected after it and a following multiplier, and has, in a branch parallel to said one branch on the input side, another linear-phase transverse filter with anti-symmetrically distributed filter coefficients and a value of one of its transfer function at said predetermined frequency, a further time-delay member connected after it and, following the latter, a further multiplier, in which connection said one multiplier on the input side is connected also with an output of the further transverse filter, and the further multiplier is connected also with the output of said one transverse filter and that circuit unit also contains a difference former the inputs of which are connected to the outputs of the multipliers; a circuit device identical in construction to the circuit unit is arranged to follow the low-pass filter, the outputs of the difference former of the circuit unit and the circuit arrangement are connected to a quotient former after which there is a square-root member, and an inverse-function former is connected to the square-root member.

One important advantage of the digital arrangement of the present invention for the measuring of the frequency of an electrical signal is that the frequency can be determined very accurately with it, since the precision is dependent only on the quality of the crystal of the oscillator used and on the resolution of the analog/digital converters which are required. The avoidance of introducing errors into the results of the measurement by component tolerance, aging phenomena and temperature variations furthermore contributes to the high precision. The use of non-recursive filters furthermore avoids problems in stability.

Filters of different order can be used in the digital arrangement of the invention. However, for a rapid carrying out of the measurement and with respect to the expense required, it is advantageous that all filters are filters of the second order and that the all-pass filter have the filter coefficients $a(0)=0$ $a(1)=1$ $a(2)=0$, the low-pass filter have the filter coefficients $t(0)=0.5$ $t(1)=1$ $t(2)=0.5$, the linear-phase transverse filter with symmetrically distributed filter coefficients have the filter coefficients $h(0)=0$ $h(1)=1$ $h(2)=0$, and the linear-phase transverse filter with anti-symmetrically distributed filter coefficients have the filter coefficients $g(0)=-0.5$ $g(1)=0$ $g(2)=+0.5$, and that the scanning frequency amount to a multiple of the predetermined frequency.

A reliable manner of operation of the digital arrangement of the invention would be dependent on a substantially pure sine signal being fed as an electrical signal to its input side. Since this is generally not the case in actual practice, particularly in the preferred case of use of the digital arrangement for measuring the frequency in an electric power supply network, in the preferred embodiment of the digital arrangement, a band-pass filter which is a digital filter is arranged jointly in front of the all-pass filter and the low-pass filter; the scanning frequency of the band-pass filter is a multiple of the scanning frequency of the other filters. In this way, assurance can be had that both the all-pass filter and the low-pass filter are acted on by a substantially pure sine quantity; on the other hand, the output signal of the band-pass filter, which is not required for the evaluation in view of the low scanning frequency of the following filters, can easily be suppressed.

BRIEF DESCRIPTION OF THE DRAWINGS

An explanation of the invention is provided in connection with the following drawings.

DETAILED DESCRIPTION

Figure 1:
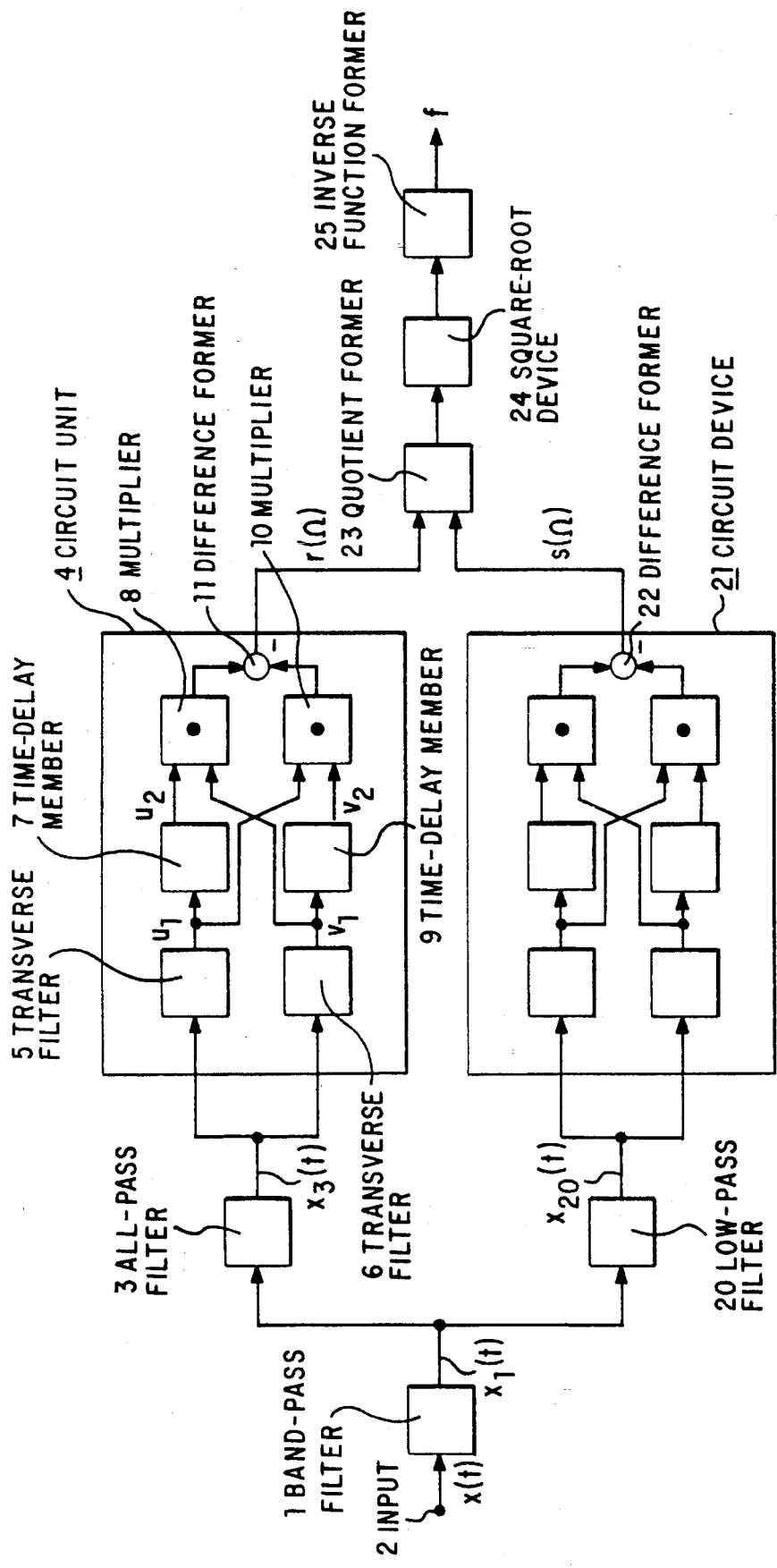
FIG. 1 illustrates a block diagram of one embodiment of a digital arrangement according to the present invention.

The digital arrangement shown in FIG. 1 has, on its input side, a band-pass filter 1, the input 2 of which is acted on by an electrical signal x(t), the frequency f of which is to be measured. The band-pass filter 1 is developed, for instance, as a linear-phase, non-recursive digital filter. Such a digital filter can be described by its transfer function $K(j\Omega)$ in accordance with the following equation (1):

$$K(j) = e^{-j\Omega N/2}\left[\sum_{n=0}^{N/2-1} 2K(n)\cos\left[\Omega\left(\frac{N}{2}-n\right)\right] + K\left(\frac{N}{2}\right)\right] \quad (1)$$

In this equation (1), $\Omega$ describes the standardized angular frequency which is defined by the following equation (2):

$$\Omega = 2 \cdot \Pi \cdot f \cdot Tab \quad (2)$$

In this equation, Tab is the duration of the scanning period. The value N in equation (1) designates the filter order, while the value k(n) indicates the filter coefficients of the digital filter. The band-pass filter 1 has its middle frequency $\Omega_0$ tuned to a predetermined frequency which, upon use of the digital arrangement for measuring the frequency in an electrical power supply network is the rated line frequency $f_n$. In one advantageous practical reduction to practice of the present invention, a band-pass filter 1 of filter order N=20 is used. At the output of the band-pass filter 1 there is then obtained an electrical signal $x_1(t)$ which represents a practically pure sine signal, even in the case of harmonics.

The signal $x_1(t)$ is fed, to an all-pass filter 3 which, in the embodiment shown, is formed by a linear-phase non-recursive digital filter with symmetrical course of its filter coefficients and with the order N=2. The filter coefficients of the all-pass filter 3 are selected as:

a(0)=0 a(1)=1, and a(2)=0

If these filter coefficients are entered, in the case of N=2, in equation (1), then the complex frequency response $A(j\Omega)$ of this filter is calculated in accordance with the following equation (3) as $$A(j^\Omega) = e^{-j\Omega} \quad (3)$$

Figure 2A:
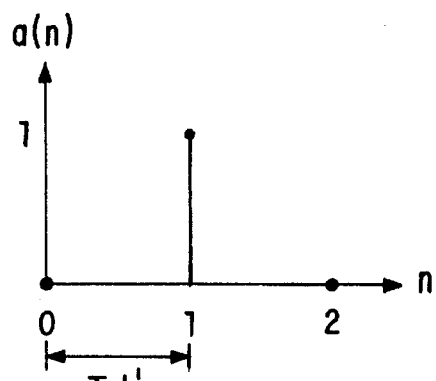
FIGS. 2a and 2b show the distribution of the filter coefficients and the course of the complex frequency response of an all-pass filter in the embodiment of FIG. 1.
Figure 2B:
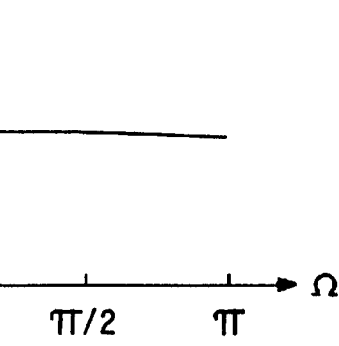

FIG. 2b shows the complex frequency response of the all-pass filter 3 over the standardized angular frequency $\Omega$. FIG. 2a shows the distribution of the filter coefficients a(n) as a function of n.

Following the all-pass filter 3 on the output side there is a circuit unit 4 which contains, on its input side, a linear-phase transverse filter 5 with symmetrically distributed filter coefficients and a further linear-phase transverse filter 6 with anti-symmetrically distributed filter coefficients. The further transverse filter 6 has, accordingly, a behavior which is differentiating as compared with said one transverse filter 5. Said one transverse filter 5 is part of a branch of the circuit unit 4 which furthermore contains a time-delay member 7 and a multiplier 8 arranged in sequence. The further transverse filter 6 is part of a branch parallel thereto which further contains a further time-delay member 9 and a further multiplier 10 arranged in sequence. A difference former 11 is arranged following and connected to the two multipliers 8 and 10.

The one linear-phase transverse filter 5 has a complex transmission function in accordance with the following equation (4):

$$H(j\Omega) = \sum_{n=0}^{N} h(n)e^{-j\Omega n} \quad (4)$$

in which $\Omega$ again represents the standardized angular frequency, N the filter order and h(n) the filter coefficients. The standardized angular frequency $\Omega$ is defined by equation (5)

$$\Omega = 2\Pi f Tab' \quad (5)$$

in which the value Tab' indicates the scanning frequency of this filter. The linear-phase transverse filter 5 is developed as all-pass filter with the complex frequency response in accordance with following equation (6):

$$H(j\Omega) = e^{-j\Omega} \quad (6)$$

It is also of the second order (N=2) and has the following filter coefficients:

h(0)=0 h(1)=1, and h(2)=0

Figure 4A:
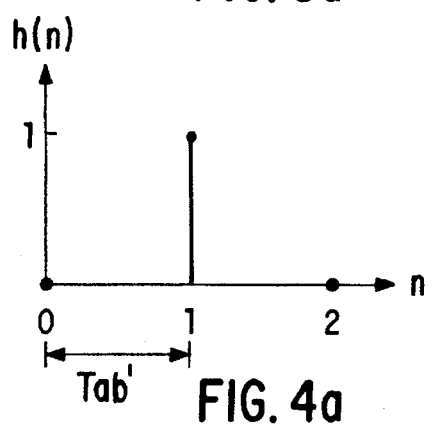
FIGS. 4a and 4b show the distribution of the filter coefficients and the course of the complex frequency response of a linear-phase transverse filter in the circuit unit or circuit device of the arrangement of FIG. 1.
Figure 4B:
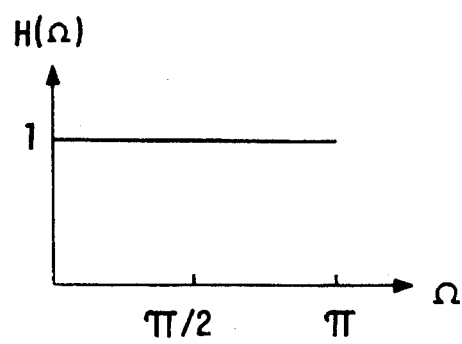

In FIG. 4b, the complex frequency response of the one linear-phase transverse filter 5 is plotted over the standardized angular frequency, while FIG. 4a shows the distribution of the filter coefficients h(n) of this transverse filter.

Figure 5A:
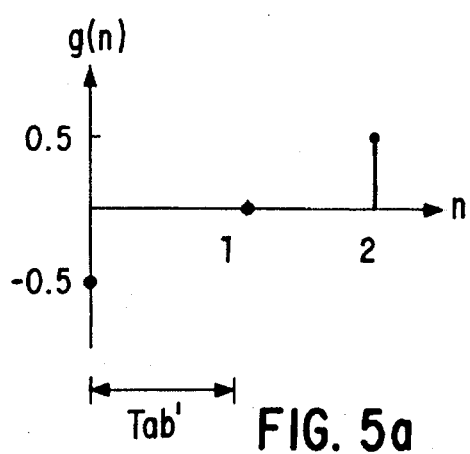
FIGS. 5a and 5b show the distribution of the filter coefficients and the course of the complex frequency response of a further linear-phase transverse filter in the circuit unit or circuit device of the arrangement of FIG. 1.

The further linear-phase transverse filter 6 is a differentiating filter which is also of the second order and has an anti-symmetrically distributed filter coefficients g(n), as set forth in FIG. 5a. Accordingly:

g(0)=−0.5 g(1)=0 g(2)=0.5.

The complex frequency response $G(j\Omega)$ can be described by the following equation (7):

$$G(j\Omega) = j \sin \Omega e^{-j\Omega} \quad (7)$$

Figure 5B:
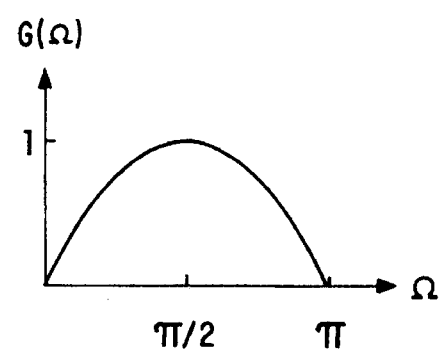

The course of the complex frequency response is shown in FIG. 5b. With $\Omega = \pi/2$, the value of the transfer function is one.

As can be noted in detail from FIG. 1, the digital values $u_1$ resulting at the output of the one transverse filter 5 are fed on the one side as values $u_2$ to the multiplier 8 via the time-delay member 7 and also directly to the further multiplier 10. In a corresponding manner, the digital values $v_1$ at the output of the further linear-phase transverse filter 6 are fed via a further time-delay member 9 as digital values $v_2$ to the further multiplier and directly to the one multiplier 8.

If the scanned signal at the output of the all-pass filter 3 is designated $x_3(t)$, then this can be described by equation (8):

$$x_3(t) = X_3 \sin(\bar{\omega}t - \phi_0) \quad (8)$$

in which $\omega$ is the angular frequency of the electrical signal x(t) and $\phi_0$ is a phase shift which has occurred in the band-pass and all-pass filters. The digital values $u_1$ at the output of the one transverse filter 5 can then be described by the following equation (9) with $\phi_H$ has phase shift in the transverse filter 5:

$$u_1(t) = H(\Omega) X_3 \sin(\overline{\omega}t - \phi_0 - \phi_H) \tag{9}$$

In corresponding manner, the digital values $v_1$ at the output of the further transverse filter 6 are defined by the following equation (10) with $\phi_G$ as phase shift in the further transverse filter 6:

$$v_1(t) = G(\Omega) X_3 \sin(\overline{\omega}t_K - \phi_0 - \phi_G) \tag{10}$$

The signals $u_2(t)$ and $v_2(t)$ can be described by equations 11 and 12:

$$u_2(t) = H(\Omega) X_3 \sin(\overline{\omega}t_K - \phi_0 - \phi_H \phi_{vz}) \tag{11}$$

$$v_2(t) = G(\Omega) X_3 \sin(\overline{\omega}t_K - \phi_0 \phi_G \phi_{vz}) \tag{12}$$

in which $\phi_{vz}$ is the phase shift by the time-delay circuits 7 and 9.

The signal $r(\Omega)$ resulting at the output of the difference former 11 is dependent—as a mathematical consideration based on the above-indicated equation shows— on the frequency responses of the quantities $H(\Omega)$ and $G(\Omega)$, the time delay $\phi_{vz}$ of the time-delay members 7 and 9, and the square of the amplitude $X_3^2$ of the electrical signal $x_3(t)$ at the output of the all-pass filter and can be described by the following equation (13):

$$r(\Omega) = H(\Omega) G(\Omega) X_3^2 \sin \phi vz \tag{13}$$

As can be noted from FIG. 1, also following the band-pass filter 1 there is a low-pass filter 20 which is also developed as a linear-phase non-recursive digital filter of second order. The filter coefficients of this low-pass filter 20 are selected as follows:

t(0)=0.5
t(1)=1
t(2)=0.5.

There thus results a complex frequency response $T(j\omega)$ in accordance with the following equation (14):

$$T(j\Omega) = [1 + \cos \Omega] e^{-j\Omega} \tag{14}$$

Figure 3A:
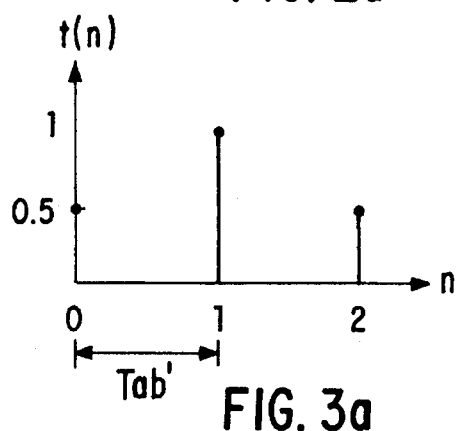
FIGS. 3a and 3b show the distribution of the filter coefficients and the course of the complex frequency response of a low-pass filter used in the arrangement of FIG. 1.
Figure 3B:
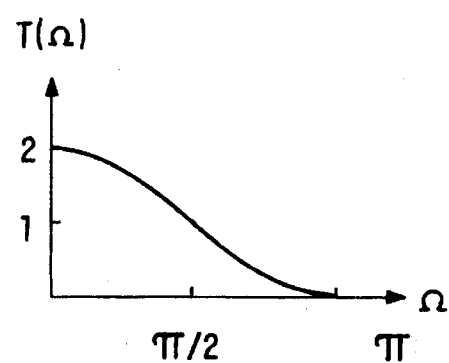

The complex frequency response of the low-pass filter 20 is in FIG. 3b and it can be seen that with $$\Omega = \frac{\pi}{2}$$

the value of the transfer function is one. The phase shift in the low-pass filter 20 corresponds in this connection to the phase shift in the all-pass filter 3.

The output signal $x_{20}(t)$ of the low-pass filter 20 is fed to a circuit device 21 which is constructed in the same manner as the circuit unit 4, which has been described in detail above. By a corresponding consideration, a signal $s(\Omega)$ which can be described by the following equation (15)

$$S(\Omega) = H(\Omega) G(\Omega) X_{20}^2 \sin \Gamma_{vz} \tag{15}$$

results at the output of a further difference former 22 of the circuit device 21.

The signals $r(\Omega)$ and $s(\Omega)$ are fed to a quotient former 23 which supplies at its output a signal $p(\Omega)$ in accordance with the following equation (16):

$$p(\Omega) = S(\Omega)/r(\Omega) = X_{20}^2/X_3^2 = [1 + \cos \Omega]^2 \tag{16}$$

Following the quotient former 23 there is a square-root device 24 which forms the output value $q(\Omega)$ from the input value $p(\Omega)$ fed to it so that the variable $q(\omega)$ can be described by the following equation (17):

$$q(\Omega) = \sqrt{p(\Omega)} - 1 = \cos \Omega \tag{17}$$

In an inverse-function former 25 arranged to follow the square-root device 24, the frequency f to be measured is then determined in accordance with the following equation (18):

$$f = \frac{1}{2\pi} \mathit{Tab} \arccos(q(\Omega)) \tag{18}$$

It is essential for the manner of operation of the arrangement described for measuring the frequency of an electrical signal that the low-pass filter 20 and the further transverse filter 6 of the circuit unit 4 or circuit device 21 do not change the amplitude of the electrical signal in the case of the predetermined electrical signal, for instance in the case of the rated frequency $f_n$ of 50 HZ in a power supply system. This, in its turn, means—as FIGS. 3 and 5 show—that this is assured only when $$\Omega = \pi/2$$

From this, using equation (2) there follows for Tab':

$$\Omega = \frac{\pi}{2} = 2 \cdot \pi \cdot f_n \cdot \mathit{Tab}'$$

$$\mathit{Tab}' = \frac{1}{4} f_n.$$

Since the scanning frequency fab' of the filters arranged following the band-pass filter 1 is inversely proportional to the duration of the scanning period, there follows from this a scanning frequency fab' which is four times the predetermined frequency $f_n$:

fab'=4. f

On basis of the above remarks it should be clear that the sensitivity of the digital arrangement described to a change in frequency is, in view of the quadratic relationship (see, for instance equation (16)), a non-linear function. For a frequency change $\Delta\Omega/\Omega = 10\%$ there results:

$$\Delta p(\Omega)/p(\Omega) > 0.288 \tag{19}$$

What is claimed is:

1. A digital arrangement for measuring the frequency of an electrical signal x(t) comprising:

a. a linear-phase non-recursive digital filter with symmetrically distributed filter coefficients (a(n)) is developed as an all-pass filter and is acted on by the electrical signal;

b. a second linear-phase non-recursive digital filter with symmetrically distributed filter coefficients (t(n)), which also acted on by the electrical signal, is so developed as a low-pass filter that its transfer function (T(n)) at a predetermined frequency ($f_n$) of the electrical signal (x(t)) has a value of one;

c. following said all-pass filter there is arranged a circuit unit which includes, i. a first branch containing a linear phase transverse filter with symmetrically distributed filter coefficients (h(n)), a time-delay member following the linear phase transverse filter and a first multiplier following said time-delay member, ii. a second branch, parallel to said first branch and having a further linear-phase transverse filter with anti-symmetrically distributed filter coefficients (g(n)) and a value of one of its transfer function with the predetermined frequency ($f_n$), a further time-delay member following said linear phase transverse filter of said second branch, and a further multiplier arranged following said further time-delay member, iii. said first multiplier on the input side also being connected to an output of said further transverse filter and the further multiplier also being connected to the output of said transverse filter, and iv. a difference former which has its inputs connected to the outputs of the first and further multipliers;

d. a circuit device, identical in construction to said circuit unit is arranged following said second linear-phase non-recursive digital filter;

e. a quotient former to which the outputs of the difference formers of said circuit unit and said circuit device are connected;

f. a square-root device following said quotient former; and g. an inverse-function being connected to said square-root device.

2. The digital arrangement of claim 1, wherein all said filters are filters of second order, and said all-pass filter has the filter coefficients
a(0)=0
a(1)=1
a(2)=0,
said low-pass filter has the filter coefficients
t(0)=0.5
t(1)=1
t(2)=0.5,
said linear phase transverse filter with symmetrically distributed filter coefficients has the filter coefficients
h(0)=0
h(1)=1
h(2)=0,
said linear-phase transverse filter with anti-symmetrically distributed filter coefficients has the filter coefficients
g(0)=−0.5
g(1)=0
g(2)=+0.5, and
a scanning frequency (fab') amounts to four times the predetermined frequency ($f_n$).

3. The digital arrangement according to claim 1, further comprising
a band-pass filter, which is a digital filter, being arranged preceding both said all-pass filter and said low-pass filter, and
a scanning frequency of said band-pass filter is four times the scanning frequency (fab') of said other filters.

4. The digital arrangement according to claim 2, further comprising
a band-pass filter, which is a digital filter, being arranged preceding both said all-pass filter and said low-pass filter, and
a scanning frequency of said band-pass filter is four times the scanning frequency (fab') of said other filters.

* * * * *